United States Patent [19]
Das

[11] Patent Number: 5,371,378
[45] Date of Patent: Dec. 6, 1994

[54] DIAMOND METAL BASE/PERMEABLE BASE TRANSISTOR AND METHOD OF MAKING SAME

[75] Inventor: Kalyankumar Das, Raleigh, N.C.

[73] Assignee: Kobe Steel USA, Inc., Research Triangle Park, N.C.

[21] Appl. No.: 895,343

[22] Filed: Jun. 8, 1992

[51] Int. Cl.$^5$ .................... H01L 29/161; H01L 29/72
[52] U.S. Cl. ..................................... 257/77; 257/197; 257/485; 257/565; 257/613
[58] Field of Search .................. 257/77, 197, 474, 485, 257/565, 587, 613, 773

[56] References Cited

U.S. PATENT DOCUMENTS

| | | | |
|---|---|---|---|
| 4,378,629 | 4/1983 | Bozler et al. | 257/266 |
| 4,643,161 | 2/1987 | Kim | 125/30 |
| 5,002,899 | 3/1991 | Geis et al. | 437/173 |
| 5,006,914 | 4/1991 | Beetz, Jr. | 357/61 |
| 5,051,785 | 9/1991 | Beetz, Jr. et al. | 257/77 |
| 5,173,761 | 12/1992 | Dreifus et al. | 257/22 |
| 5,243,199 | 9/1993 | Shiomi et al. | 257/77 |

FOREIGN PATENT DOCUMENTS 0343963 11/1989 European Pat. Off. .

OTHER PUBLICATIONS

*High–Temperature Point–Contact Transistors and Schottky Diodes Formed on Synthetic Boron–Doped Diamond*, M. W. Geis et al., IEEE Electron Device Letters, vol. EDL-8, No. 8, Aug. 1987, pp. 341–343.
*Ohmic Contacts to Semiconducting Diamond*, K. L. Moazed et al., IEEE Electron Device Letters, vol. 9, No. 7, Jul., 1988, pp. 350–351.
*Effective p-type Doping of Diamond by Boron Ion Implanation*, G. Braunstein et al., J. Appl. Phys., vol. 54, No. 4, Apr. 1983, pp. 2106–2108.
*A Review of the Electrical Characteristics of Metal Contacts on Diamond*, K. Das et al., pp. 1–8.
*A Thermally Activated Solid State Reaction Process for Fabricating Ohmic Contacts to Semiconducting Diamond*, K. L. Moazed, J. Appl. Phys. 68(5), Sep. 1990, pp. 2246–2254.
*High Temperature Rectifying Contacts Using Hetero-epitaxial Ni Films on Semiconducting Diamond*, T. P. Humphreys et al., Japanese Journal of Applied Physics, vol. 30, No. 8A, Aug. 1991, pp. L1409–L1411.
*Characterization of Boron–Doped Diamond Epitaxial Films and Applications for High–Voltage Schottky Diodes*

(List continued on next page.)

Primary Examiner—Mark V. Prenty
Attorney, Agent, or Firm—Bell, Seltzer, Park & Gibson

[57] ABSTRACT

A diamond transistor includes a base layer formed of a conductive material which is lattice matched to diamond, and which is embedded between two epitaxial diamond layers to form a monolithic heterostructure. An emitter contact is electrically connected to one diamond layer and a collector contact is electrically connected to the other diamond layer. The base layer may be a solid base layer, in which case a metal base transistor is formed. Alternatively, the base layer may be a patterned base layer having a grid of laterally spaced apart conductor lines, in which case a permeable base transistor is formed. Alternatively, the epitaxial diamond layers may be doped diamond layers of the same conductivity type. The epitaxial diamond layers may be undoped diamond layers formed between highly doped diamond layers, with the collector and emitter contacts being formed on the highly doped diamond layers to provide low resistance contacts. The transistor is preferably formed by epitaxially forming a first undoped diamond layer on a first heavily doped diamond layer. A metal base electrode is then epitaxially formed on the first undoped diamond layer. A second undoped diamond layer is epitaxially formed on the metal base electrode. A second heavily doped diamond layer is then formed on the second undoped diamond layer, and emitter and collector contacts are formed on the exposed faces of the respective heavily doped monocrystalline diamond layers.

20 Claims, 5 Drawing Sheets

OTHER PUBLICATIONS

*and MESFET's*, H. Shiomi et al., New Diamond Science and Technology, mRS Int. Conf. Proc. 1991, pp. 975–980.

*Metal–Insulator–Semiconductor Diodes Using Polycrystalline Diamond Thin Films*, K. Miyata et al., pp. 1–8.

*Bipolar Transistor*, S. M. Sze, Physics of Semiconductor Devices, 2nd Ed. John Wiley, New York, 1981, pp. 184–186.

*Novel GaAs Devices*, M. Shur, GaAs Devices and Circuits, Plenum Press, New York, 198, pp. 611–615.

*Summary Abstract: Device Applications of Diamonds*, M. W. Geis et al., J. Vac. Sci. Technol. A6(3), May/Jun. 1988, pp. 1953–1954.

*Diamond Transistor Performance and Fabrication*, M. W. Geis, Proceedings of the IEEE, vol. 79, No. 5, May 1991, pp. 669–676.

DIAMOND METAL BASE/PERMEABLE BASE TRANSISTOR AND METHOD OF MAKING SAME

FIELD OF THE INVENTION

This invention relates to semiconductor devices, and more particularly to transistors and methods for making the same.

BACKGROUND OF THE INVENTION

Metal base transistors have been widely investigated because they can provide better high frequency performance than conventional bipolar transistors. A metal base transistor uses "hot electron" transport from emitter to collector. As is well known to those having skill in the art, a hot electron is an electron with energy more than a few kT above the Fermi energy, where k is Boltzmann's constant and T is the lattice temperature. Hot electron devices may be modeled after the vacuum tube diode because the transported electrons are not in thermal equilibrium. Since these hot carriers are transported through the base at high velocities, a short transit time and a potentially large current gain may be obtained.

A metal base transistor has been fabricated by embedding a 90 Ångstrom thick gold film between epitaxial layers of silicon and germanium. See the textbook entitled *Physics of Semiconductor Devices* by Sze, Section 3.64, p. 184, published by John Wiley, 1981. As is well known to those having skill in the art, an epitaxial layer is a monocrystalline layer which is lattice matched to an adjacent monocrystalline layer to create a monolithic monocrystalline two-layer structure. In fabricating the silicon/germanium metal base transistor, a 90 Ångstrom gold film layer was grown on a single crystal silicon film using molecular beam epitaxy, and a monocrystalline germanium film was grown on the monocrystalline gold film.

The permeable base transistor may be considered a variant of the metal base transistor. In a permeable base transistor, an ultrafine metal grid is formed between epitaxial semiconductor films. The metal forms a Schottky (rectifying) barrier with the surrounding semiconductor material, and the built-in voltage totally depletes the spaces in the grid. When a sufficient positive bias is applied to the base electrode, the depletion layer shrinks and a conductive path forms between the collector and emitter. The cutoff frequency of such a device is a strong function of the grid size and is presently close to 40 GHz. Cutoff frequencies close to 200 GHz are possible if the grid size is decreased to about 500Å. See Chapter 11 of the textbook by M. Shur entitled *GaAs Devices and Circuits*, pp. 611–615, published by Plenum Press, 1987.

A permeable base transistor has been fabricated using an n+ gallium arsenide substrate, on which an n type gallium arsenide emitter layer is formed. A patterned metal film, such as tungsten with a thickness of 200Å and a Schottky barrier height of 0.8V, is formed on the n-type gallium arsenide emitter layer. The tungsten film has a conductive line width of 1600Å and spaces between the lines of about 1600Å. An n type collector layer is then formed on the tungsten conductive lines and on the underlying gallium arsenide emitter layer between the lines. X-ray lithography and epitaxial overgrowth were used to epitaxially form the metal permeable base on the underlying n type gallium arsenide layer and form the overlying gallium arsenide layer on the metal base. See the above cited textbook to Sze, Section 3.6.5, pp. 84–186. With such a fine base grating and an appropriate carrier concentration, barrier limited current flow can exist at high current densities, resulting in a large transconductance and a large maximum operating frequency.

As described above, metal base and permeable base transistors have been fabricated in silicon, germanium and gallium arsenide. However, diamond is a preferred material for semiconductor devices because it has semiconductor properties that are better than silicon, germanium or gallium arsenide. Diamond provides a higher energy bandgap, a higher breakdown voltage and a higher saturation velocity than these traditional semiconductor materials.

These properties of diamond yield a substantial increase in projected cutoff frequency and maximum operating voltage compared to devices fabricated using silicon, germanium or gallium arsenide. Silicon is typically not used at temperatures higher than about 200° C. and gallium arsenide is not typically used above 300° C. These temperature limitations are caused, in part, because of the relatively small energy band gaps for silicon (1.12 eV at ambient temperature) and gallium arsenide (1.42 eV at ambient temperature). Diamond, in contrast, has a large band gap of 5.47 eV at ambient temperature, and is thermally stable up to about 1400° C.

Diamond has the highest thermal conductivity of any solid at room temperature and exhibits good thermal conductivity over a wide temperature range. The high thermal conductivity of diamond may be advantageously used to remove waste heat from an integrated circuit, particularly as integration densities increase. In addition, diamond has a smaller neutron cross-section which reduces its degradation in radioactive environments, i.e., diamond is a "radiation-hard" material.

Because of the advantages of diamond as a material for semiconductor devices, there is at present an interest in the growth and use of diamond for high temperature and radiation-hardened electronic devices. In particular, the art has investigated diamond metal base/permeable base transistors.

FIG. 4A of a publication by M. W. Geis et al. entitled Summary Abstract: *Device Applications of Diamond, Journal of Vacuum Science Technology*, Vol. A6, No. 3, May-June, 1988, pp. 1953–1954, describes a diamond transistor in which a grating pattern is formed in a boron doped diamond layer, and the resultant trenches are lined with chemically vapor deposited silicon dioxide. An aluminum layer is formed at the bottom of each trench, with an ohmic collector contact formed to the top of the trenches and an ohmic emitter contact formed at the bottom of the boron doped diamond layer. As described in this publication, the device has a transconductance of $30\mu S$ mm$^{-1}$, which results from parasitic resistance of the device associated with the high substrate resistance. See also FIG. 2(a) of a publication by M. W. Geis entitled *Diamond Transistor Performance and Fabrication*, Proceedings of the IEEE, Vol. 79, No. 5, May 1991, pp. 669–676, which identifies this transistor as a vertical field effect transistor. Notwithstanding the above publications, there exists a need for improved metal base and permeable base bipolar transistor structures which are particularly adapted for fabrication in diamond.

SUMMARY OF THE INVENTION

It is therefore an object of the present invention to provide a metal base/permeable base transistor and methods of making the same.

It is another object of the present invention to provide a high performance, metal base/permeable base transistor fabricated in diamond and methods of making the same.

These and other objects are provided, according to the invention, by a base layer, comprising a solid or patterned conductive material, which is sandwiched between two diamond layers. An emitter contact is electrically connected to one diamond layer and a collector contact is electrically connected to the other diamond layer to form a metal base or permeable base transistor.

In particular, according to the present invention, the transistor includes a base layer, comprising a conductive material which has a relatively close lattice match to diamond, and has first and second opposing faces. The base layer preferably comprises a layer of crystalline copper, nickel or alloys thereof, and is preferably between about 20Å-500Å thick. Alternatively, the base layer may be a heavily doped diamond layer. The transistor includes a first diamond layer on the first face of the base layer and a second diamond layer on the second face of the base layer. The first and second diamond layers and the base layer form a rectifying contact at both faces of the base layer.

In order to form the rectifying contacts, the first and second diamond layers may comprise first and second doped diamond layers, both of the same (n or p) conductivity type. Alternatively, in order to form a rectifying contact, the first and second diamond layers may each comprise an undoped portion adjacent the base layer, and a doped portion of predetermined conductivity type, opposite the base layer. Emitter and collector contacts are electrically connected to the respective doped layers or portions to form the transistor.

The base layer may be a solid layer of conductive material which forms a rectifying contact with the first and second diamond layers to form a metal base transistor. Alternatively, the base layer may include a plurality of spaced apart conductive lines arranged in a grid, with diamond in the spaces between adjacent ones of the conductive lines, to form a permeable base transistor.

The transistor of the present invention may be formed by homoepitaxially forming an undoped diamond layer on a doped diamond layer. A base layer is then heteroepitaxially or homoepitaxially formed on the undoped diamond layer and a second undoped diamond layer is heteroepitaxially or homoepitaxially formed on the base layer. A doped diamond layer is then homoepitaxially formed on the second undoped diamond layer, and emitter and collector contacts are formed on the exposed faces of the respective heavily doped diamond layers. In forming the base layer, a blanket epitaxial deposition may be used to form a metal base transistor. Alternatively, a patterned conductive base layer may be formed, including a plurality of conductive spaced apart lines and a base contact pad. The undoped second diamond layer may then be epitaxially grown on the conductive metal lines and on the underlying undoped diamond layer between the conductive lines, but not on the base contact pad. The base contact pad may then be used to contact the permeable base layer.

The metal base/permeable base diamond transistor of the present invention, with its thin base metal electrode embedded in diamond, extends the power and frequency range of existing high frequency power devices.

DESCRIPTION OF THE PREFERRED EMBODIMENT

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 1:
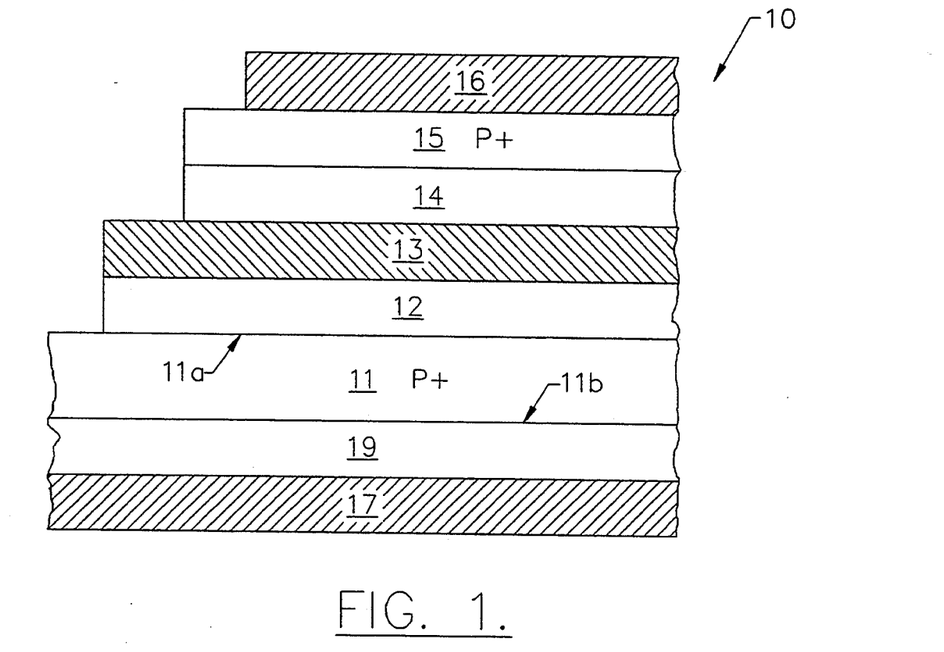
FIG. 1 is a cross-sectional side view of a diamond metal base transistor according to the present invention.

Referring now to FIG. 1, a metal base transistor according to the present invention is shown. As shown, metal base transistor 10 includes a first doped layer 11 of polycrystalline diamond or monocrystalline diamond, having a first (top) face 11a and a second (bottom) face 11b. It will also be understood by those having skill in the art that first doped diamond layer 11 may itself be formed on a nondiamond substrate 19, such as a heavily doped monocrystalline silicon substrate of like conductivity type, between 200μm-500μm thick. Alternatively, to facilitate formation of monocrystalline diamond layer 11, nondiamond substrate 19 is preferably crystalline silicon carbide, cubic boron nitride, crystalline copper or crystalline nickel. The first doped diamond layer 11 is preferably formed by boron doping, at a concentration of $10^{18}$-$10^{20}$ boron atoms cm$^{-3}$, and the top face 11a is preferably polished using the technique described in U.S. Pat. No. 4,643,161 to Kim, entitled *Method of Machining Hard and Brittle Material* or other well known chemical machining techniques. Other p-type dopants, such as those from Group IIIb, may also be used.

Still referring to FIG. 1, a first undoped monocrystalline diamond layer 12 is located on first face 11a of layer 11. First undoped monocrystalline diamond layer 12 is preferably 50Å-1000Å thick. The undoped monocrystalline diamond layer may be formed using homoepitaxial deposition techniques, so that a monolithic monocrystalline structure is formed by layers 11 and 12. Accordingly, a first diamond layer, having a doped portion (comprising first doped layer 11) and an undoped portion (comprising first undoped layer 12) is formed.

Still referring to FIG. 1, an epitaxial base layer 13 is provided on first undoped monocrystalline diamond layer 12. The thin crystalline base layer 13 may be formed of nickel, nickel copper alloys, or copper, or any other metal or material that forms a rectifying contact on diamond and has a heteroepitaxial relationship with the diamond lattice; i.e., is matched with the diamond lattice. Base layer 13 is preferably a nondiamond base layer. Alternatively, a heavily doped (about $10^{20}$–$10^{21}$ boron atoms cm$^{-3}$) conductive diamond base layer may also be used. The thickness of base layer 13 may vary between about 20Å–500Å.

A second epitaxial undoped monocrystalline diamond layer 14 is located on base layer 13. A second doped monocrystalline diamond layer 15 of like conductivity type is located on the second undoped monocrystalline diamond layer. Accordingly, a second diamond layer, having a doped portion (comprising second doped diamond layer 15) and an undoped portion (comprising second undoped diamond layer 14) is formed. It will be understood by those having skill in the art that layers 11, 12, 14 and 15 may be polycrystalline diamond. A metal film 16 on doped monocrystalline diamond layer 15 provides the collector contact, and a contact 17 on the second (bottom) face 11b of layer 11 forms an emitter contact. A base contact (not shown) to base layer 13 may also be provided. Upon application of appropriate biases to the base 13, collector contact 16 and emitter contact 17, hot carrier transport from emitter to collector is provided to produce high gain, high frequency performance.

The diamond layers on both faces of the base layer 13 form rectifying (Schottky) contacts with the base layer. It will be understood by those having skill in the art that a rectifying contact may be provided by a doped layer adjacent the base layer. Accordingly, doped layers 11 and 15 may be provided adjacent base layer 13, without the need for intervening undoped diamond layers 12 and 14. However, due to the limitations of the surface quality of diamond, a rectifying contact is facilitated by providing an undoped diamond layer (12, 14) between each doped diamond layer 11, 15 and the base 13. See Miyata et al., *Metal-Insulator-Semiconductor Diodes Using Polycrystalline Diamond Thin Films*, Electrochemical Society, May 6–10, 1991. Also see Shiomi et al., *Characterization of Boron-Doped Diamond Epitaxial Films and Applications for High-Voltage Schottky Diodes and MESFET's*, 1991 MRS International Conference Proceeding, pp. 975–980. It will also be understood by those having skill in the art that doped layers 11 and 15 also form a low resistance contact with collector contact 16 and emitter contact 17, respectively.

Figure 2:
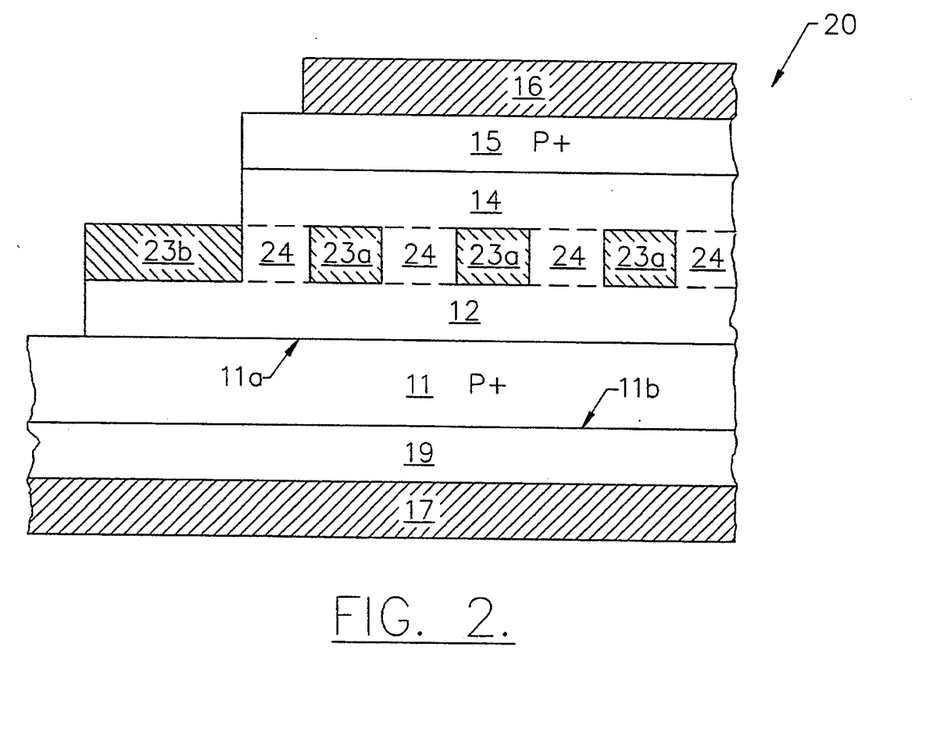
FIG. 2 is a cross-sectional side view of a diamond permeable base transistor according to the present invention.

Referring now to FIG. 2, a permeable base transistor according to the present invention will now be described. Permeable base transistor 20 is similar to the metal base transistor of FIG. 1, except that the base layer includes a grid of spaced apart conductive lines 23a and a contact pad 23b, rather than the solid metal base layer 13 of FIG. 1. As shown, diamond filler 24 is formed between conductive lines 23a and extends from the first undoped monocrystalline diamond layer 12 to the second undoped monocrystalline diamond layer 14. Preferably, the conductive metal lines 23a are about 800Å–2500Å wide, have a space therebetween of about 800Å–2500Å, and are about 20Å–500Å thick. The permeable base transistor allows barrier limited current flow to exist at high current densities, resulting in large transconductance and a high operating frequency.

Referring now to FIG. 3, a method for fabricating a metal base transistor of FIG. 1 will now be described. As shown in FIG. 3A, a chemical vapor deposited diamond layer 11 with a high concentration of boron (such as about $10^{18}$–$10^{20}$ atoms cm$^{-3}$) may be deposited on a highly doped p-type low resistivity silicon wafer 19, such as less than about 0.001Ωcm monocrystalline silicon wafer, and boron doped at a concentration of $10^{19}$–$10^{20}$ atoms cm$^{-3}$. This chemical vapor deposition forms a doped polycrystalline diamond layer 11 between about 0.5μm to 5.0μm thick. It will be understood by those having skill in the art that even if polycrystalline diamond films are formed, their properties can be similar to monocrystalline diamond film because of the minimum number of grain boundaries which need be crossed by carriers moving vertically between the emitter and collector.

Figure 3A:
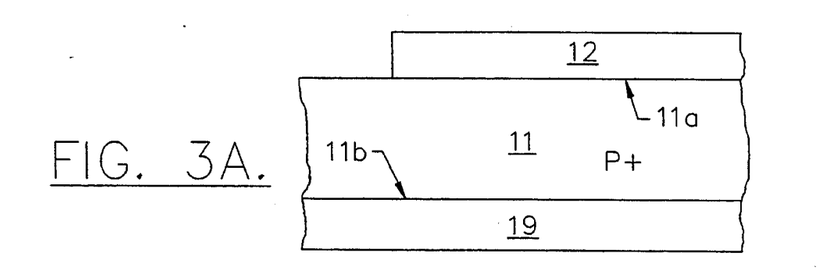
FIGS. 3A-3F are cross-sectional side views of the diamond metal base transistor of FIG. 1 during intermediate processing steps.

Alternatively, a monocrystalline diamond layer 11 may be formed on a nondiamond substrate which has a close lattice match to diamond, such as crystalline silicon carbide, cubic boron nitride, crystalline copper or crystalline nickel. The top surface 11a of doped diamond layer 11 is then polished. A first undoped monocrystalline diamond layer 12 is then deposited on the polished top face 11a and itself may be repolished.

Figure 3B:
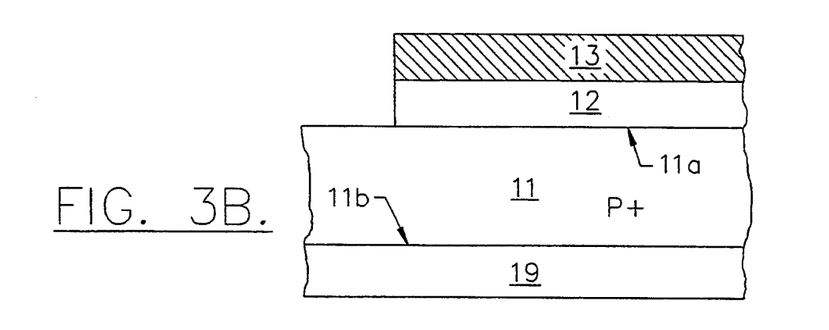

Then, as shown in FIG. 3B, a base layer 13 is heteroepitaxially deposited on first undoped monocrystalline diamond layer 12. The base layer may be a thin film of nickel, nickel copper alloy (for example 80% nickel, 20% copper) or copper, or any other metal/material that forms a rectifying contact on undoped or doped diamond and has a heteroepitaxial relationship with the diamond lattice. The thickness of metal layer 13 may range between 20Å and 500Å. The layer 13 is patterned using photolithography, E-beam lithography or other well known techniques to define the device.

The heteroepitaxial deposition of nickel layers on semiconducting diamond to form a high temperature rectifying contact is described in a publication by Humphreys et al. entitled *High Temperature Rectifying Contacts Using Heteroepitaxial Ni Films on Semiconducting Diamond*, Japanese Journal of Applied Physics, Vol. 30, No. 8A, August, 1991, pp. L1409–L1411. It was shown that nickel can be thermally evaporated from a tungsten filament onto a sample of commercially supplied, low resistivity semiconducting natural diamond. In situ low energy and electron diffraction studies demonstrated that heteroepitaxial nickel films were achieved and that the heteroepitaxial film formed a rectifying contact with the underlying diamond substrate. The contacts are electrically and thermally stable over a wide temperature range. Moreover, as a result of strong interface atomic bonding, the nickel films exhibited excellent adhesion properties with the underlying diamond substrate.

The metal of the base layer 13 preferably has a lattice match with the monocrystalline semiconducting diamond layer. By lattice matching, the layers are in atomic registry, namely crystal structures are substantially in alignment with each other. Lattice match relates to the difference between the lattice constant ("a$_0$") of diamond and the metal, and is typically expressed in terms of "lattice mismatch". Preferably, the lattice mismatch is less than about 7%, preferably less than about 4%, and more preferably less than about 2% relative to the lattice constant of diamond. The lattice matching results in a strong atomic bonding and an atomically abrupt interface. This permits stable rectifying operation of the contact at operating temperatures of about 400° C. and beyond, and provides excellent adhesion of the base layer 13 at these elevated operating temperatures.

Preferably the base layer 13 has no stable metal carbides so that carbide formation is avoided at higher temperatures. The conductive nondiamond material in the base layer is preferably nickel, copper, nickel/copper alloy or an alloy of nickel and a metal having minimal stable metal carbides and capable of forming a homogenous alloy with nickel (e.g. gold, palladium, platinum, etc.). These metals and alloys are selected because of their relatively close lattice match with diamond. In particular, the lattice constant of diamond is 3.5668Å, and the lattice constant of nickel is 3.5238Å, resulting in a lattice mismatch of about 1.2%. The lattice constant of copper is 3.6153Å, thereby producing a lattice mismatch with diamond of about 1.4%.

Alternatively, conductive base layer 13 may be formed by homoepitaxially forming a relatively heavily doped diamond layer (about $10^{20}$–$10^{21}$ dopants cm$^{-3}$) on first undoped diamond layer 12. The relatively heavily doped diamond layer acts as a metallic conductor layer to form a rectifying contact with undoped diamond layer 12 and relatively lightly doped diamond layer 11. Heavily doped diamond layer 13 may be formed by implantation of boron, at a dose on the order of $10^{16}$ and at moderate acceleration. An anneal is then performed at approximately 1200° C. The graphitized surface layer so formed is removed by etching the substrate in a hot $CrO_3 + H_2SO_4$ solution so that a portion of the implanted boron profile is retained in the diamond. This contributes to a surface concentration on the order of $10^{20}$–$10^{21}$ boron atoms cm$^{-3}$.

Figure 3C:
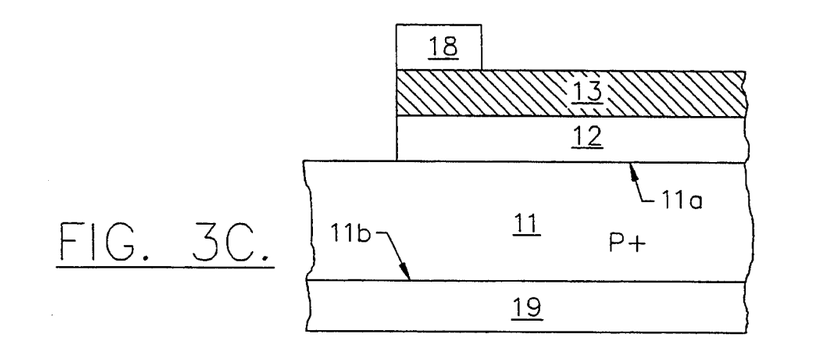

Referring now to FIG. 3C, a mask 18 may then be formed over a portion of base layer 13 to prevent subsequent nucleation of diamond thereon. Mask 18 may be formed of silicon dioxide or any other well known masking material and may be deposited by blanket depositing silicon or silicon dioxide and then photolithographically patterning the blanket deposited silicon dioxide to retain the protective layer of silicon dioxide 18 only on the contact pad area. Other well known patterning techniques may be used.

Figure 3D:
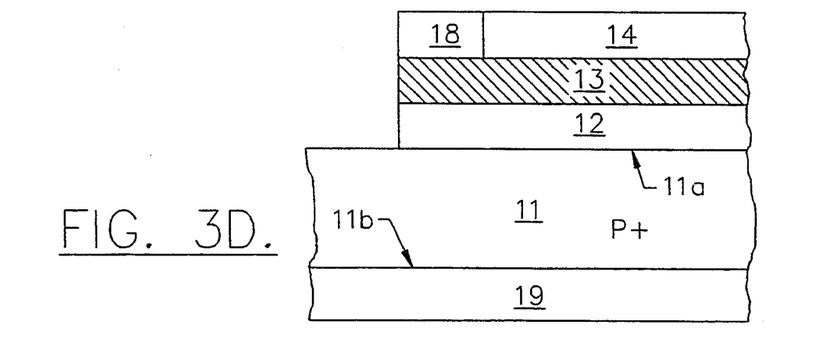
Figure 3E:
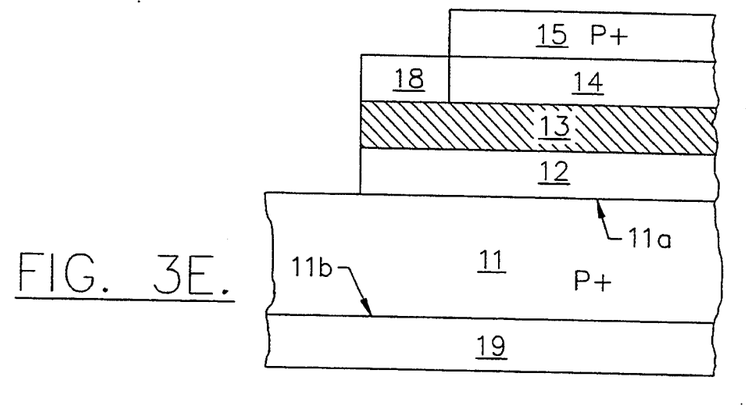

Referring now to FIG. 3D, a second undoped diamond layer 14 is then epitaxially grown on the base layer 13, except for that portion protected by silicon dioxide mask 18. The thickness and other characteristics of second undoped diamond layer 14 are preferably similar to first undoped diamond layer 12. Nucleation of the diamond will not occur on the $SiO_2$ mask. As shown in FIG. 3E, second doped monocrystalline diamond layer 15 is then epitaxially formed on the second undoped monocrystalline diamond layer 14. Second doped monocrystalline diamond layer 15 is preferably about 0.5μm–5.0μm thick and doped at a concentration of $10^{18}$–$10^{20}$ atoms cm$^{-3}$. Alternatively, the heavily doped layer 15 may be formed by implantation of boron into layer 14.

Figure 3F:
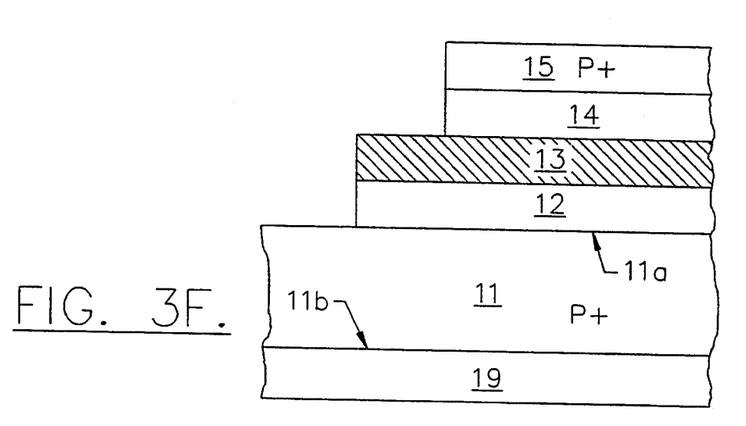

As shown in FIG. 3F, the silicon dioxide mask 18 is then removed to expose a contact for metal base layer 13. A collector contact 16 and an emitter contact 17 may then be added using conventional metallization techniques to produce the structure shown in FIG. 1. The collector contact 16 and emitter contact 17 may be gold, or may be a layer of gold, preferably about 1000Å to about 1500Å thick, on a refractory metal layer preferably titanium about 200Å to about 400Å thick. See Moazed et al., *A Thermally Activated Solid State Reaction Process for Fabricating Ohmic Contacts to Semiconducting Diamond*, Applied Physics Journal, Vol. 68, No. 5, September 1990. Other contact structures may also be used.

Figure 4A:
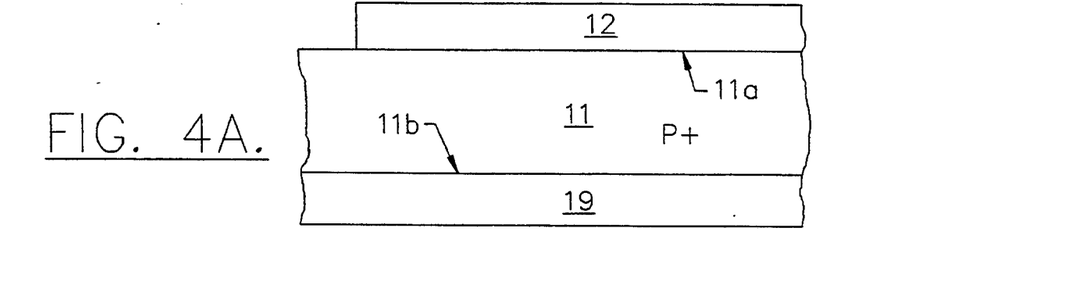
FIGS. 4A-4G are cross-sectional side views of the diamond permeable base transistor of FIG. 2 during intermediate processing steps.
Figure 4B:
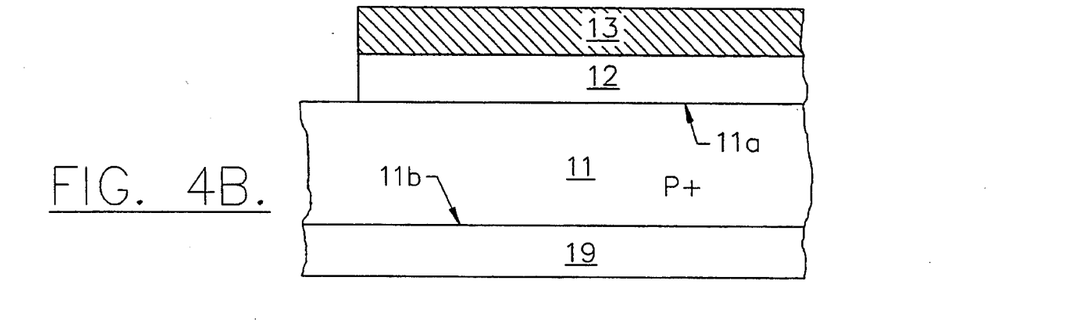
Figure 4C:
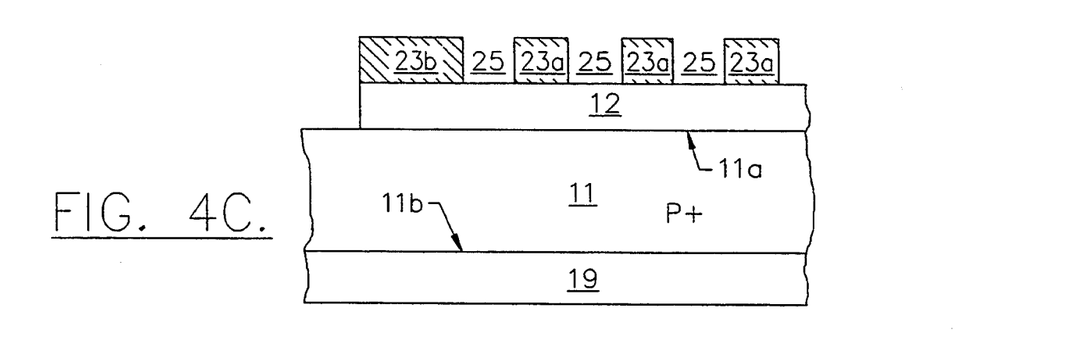

Referring now to FIGS. 4A–4G, a process for forming the permeable base transistor 20 of FIG. 2 will now be described. The intermediate structures shown in FIGS. 4A and 4B, are identical to that shown in FIGS. 3A and 3B, respectively, for the metal base transistor. Then, as shown in FIG. 4C, the continuous base layer 13 is patterned, using conventional photolithography, electron beam lithography or other techniques, to produce a grid of conductive lines 23a having spaces 25 therebetween, and a contact pad 23b. The conductive lines 23a are preferably about 800Å–2500521 wide and about 20Å–500Å thick. The spaces are preferably about 800Å–2500Å wide. It will be understood by those having skill in the art that the conductive lines and contact pad may also be formed by a selective area deposition of metal or diamond on underlying diamond layer 12 using a mask.

Figure 4D:
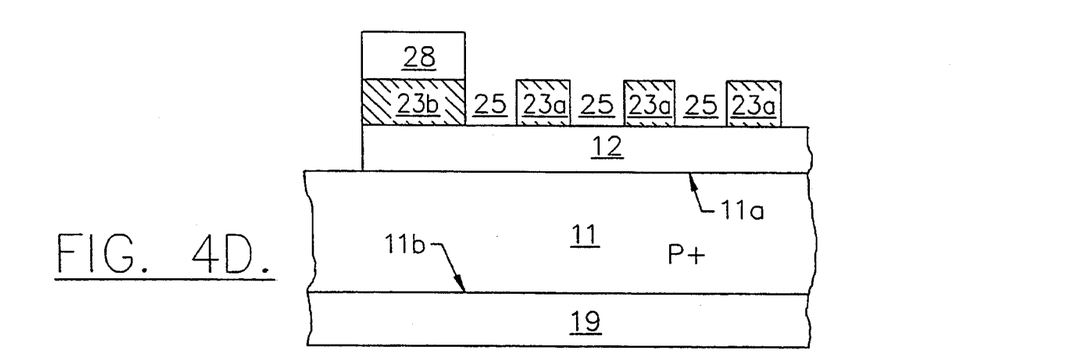

Then, as shown in FIG. 4D, a mask such as a silicon or silicon dioxide mask 28 is deposited and patterned on the contact pad 23b. Undoped diamond is then epitaxially deposited on conductive lines 23a and on first undoped monocrystalline diamond layer 12 in the spaces 25 between the conductive lines 23a. This epitaxial deposition forms undoped monocrystalline diamond 24 in the spaces 25 between the conductive lines 23a, and a second undoped monocrystalline diamond layer 14 on the conductive lines 23a and the undoped monocrystalline layer 24.

Figure 4E:
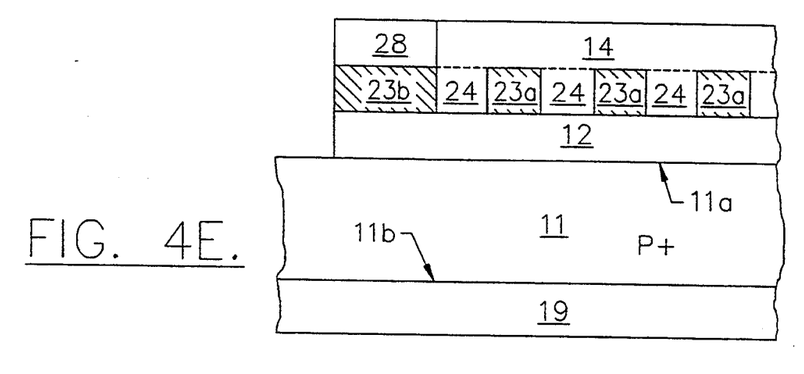
Figure 4F:
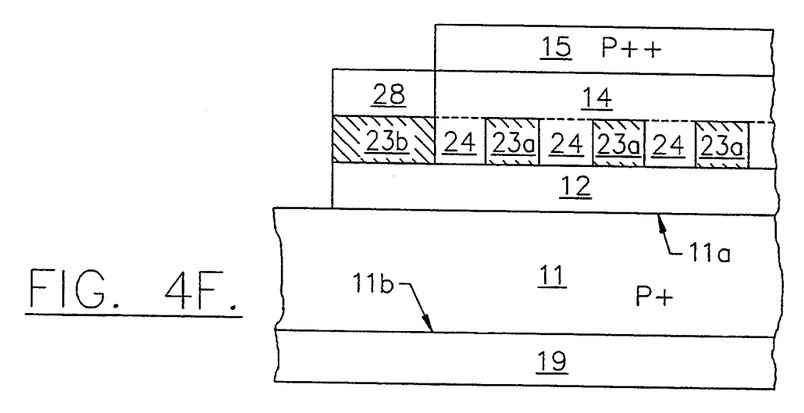
Figure 4G:
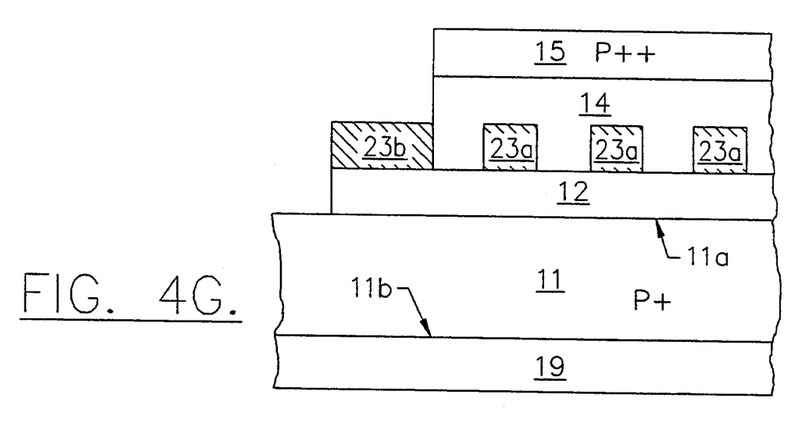

It will be understood by those having skill in the art that although FIG. 4E illustrates three distinct undoped monocrystalline diamond regions 14, and 24, these regions preferably form a monolithic, undoped monocrystalline diamond structure which surrounds crystalline conductive lines 23a, to provide permeable base transistor action. Finally, as shown in FIGS. 4F and 4G, a doped monocrystalline diamond layer 15 is formed and the silicon or silicon dioxide mask is removed, as was already described with regard to FIGS. 3E and 3F respectively. Emitter and collector contacts 17 and 16 respectively may be formed to produce the structure shown in FIG. 2. It will be understood by those having skill in the art that the emitter and collector contacts may be reversed and that the conductivity types described herein may be reversed to provide a complementary bipolar transistor.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A transistor comprising:
   a base layer comprising a conductive material, said base layer having first and second opposing faces;
   a first diamond layer on said first face of said base layer;
   a second diamond layer on said first face of said base layer;
   an emitter contact electrically connected to said first diamond layer; and
   a collector contact electrically connected to said second diamond layer;
   wherein said first and second diamond layers comprise first and second undoped diamond layers.

2. The transistor of claim 1 wherein said first and second undoped diamond layers comprise first and second undoped heteroepitaxial diamond layers.

3. The transistor of claim 1 wherein said conductive material comprises crystalline conductive material having a relatively close lattice match to diamond.

4. The transistor of claim 1 wherein said conductive material comprises heavily doped diamond.

5. The transistor of claim 1 wherein said base layer is about 20-500 Ångstroms thick.

6. A transistor comprising:
a base layer comprising a conductive material, said base layer having first and second opposing faces;
a first diamond layer on said first face of said base layer;
a second diamond layer on said second face of said base layer;
an emitter contact electrically connected to said first diamond layer; and
a collector contact electrically connected to said second diamond layer;
wherein said first diamond layer comprises:
a first undoped portion adjacent said base layer, and
a first doped portion of predetermined conductivity type, opposite said base layer;
said emitter contact being on said first doped portion.

7. The transistor of claim 6 wherein said second diamond layer comprises:
a second undoped portion adjacent said base layer; and
a second doped portion of said predetermined conductivity type, opposite said base layer;
said collector contact being on said second doped portion.

8. The transistor of claim 7 wherein said first and second undoped portions comprise first and second undoped heteroepitaxial portions.

9. A transistor comprising:
a solid conductive base layer having relatively close lattice match to diamond, said solid conductive base layer having first and second opposing faces;
a first diamond layer on said first face of said solid conductive base layer;
a second diamond layer on said second face of said base layer;
an emitter contact electrically connected to said first diamond layer; and
a collector contact electrically connected to said second diamond layer;
wherein said first and second diamond layers comprise first and second undoped diamond layers.

10. The transistor of claim 9 wherein said first and second undoped diamond layers comprise first and second undoped heteroepitaxial diamond layers.

11. A transistor comprising:
a solid conductive base layer having relatively close lattice match to diamond, said solid conductive base layer having first and second opposing faces;
a first diamond layer on said first face of said solid conductive base layer;
a second diamond layer on said second face of said base layer;
an emitter contact electrically connected to said first diamond layer; and
a collector contact electrically connected to said second diamond layer;
wherein said first diamond layer comprises:
a first undoped portion adjacent said solid conductive base layer, and
a first doped portion of predetermined conductivity type, opposite said solid conductive base layer;
said emitter contact being on said first doped portion.

12. The transistor of claim 11 wherein said second diamond layer comprises:
a second undoped portion adjacent said solid conductive base layer; and
a second doped portion of said predetermined conductivity type, opposite said solid conductive base layer;
said collector contact being on said second doped portion.

13. The transistor of claim 12 wherein said first and second undoped diamond layers comprise first and second undoped heteroepitaxial diamond layers.

14. A permeable base transistor comprising:
a base layer comprising a grid of spaced apart conductive lines, and diamond in the spaces between adjacent ones of said conductive lines, said conductive lines having a relatively close lattice match to diamond, said base layer having first and second opposing faces;
a first diamond layer on said first face of said base layer;
a second diamond layer on said second face of said base layer;
an emitter contact electrically connected to said first diamond layer; and
a collector contact electrically connected to said second diamond layer;
wherein said first and second diamond layers and said diamond in said spaces comprise undoped diamond.

15. The permeable base transistor of claim 14 wherein said first and second undoped diamond layers and said undoped diamond in said spaces form a monocrystalline structure.

16. A permeable base transistor comprising:
a base layer comprising a grid of spaced apart conductive lines, and diamond in the spaces between adjacent ones of said conductive lines, said conductive lines having a relatively close lattice match to diamond, said base layer having first and second opposing faces;
a first diamond layer on said first face of said base layer;
a second diamond layer on said second face of said base layer;
an emitter contact electrically connected to said first diamond layer; and
a collector contact electrically connected to said second diamond layer;
wherein said grid of conductive lines comprise a grid of heavily doped diamond lines.

17. A permeable base transistor comprising:
a base layer comprising a grid of spaced apart conductive lines, and diamond in the spaces between adjacent ones of said conductive lines, said conductive lines having a relatively close lattice match to diamond, said base layer having first and second opposing faces;
a first diamond layer on said first face of said base layer;
a second diamond layer on said second face of said base layer;

an emitter contact electrically connected to said first diamond layer; and a collector contact electrically connected to said second diamond layer;

wherein said first diamond layer comprises:
   a first undoped portion adjacent said base layer, and
   a first doped portion of predetermined conductivity type, opposite said base layer;
   said emitter contact being on said first doped portion.

18. The permeable base transistor of claim 17 wherein said second diamond layer comprises:
   a second undoped portion adjacent said base layer; and
   a second doped portion of said predetermined conductivity type, opposite said base layer;
   said collector contact being on said second doped portion.

19. The permeable base transistor of claim 18 wherein said first and second undoped diamond layers and said undoped diamond in said spaces form a monocrystalline structure.

20. A permeable base transistor comprising:
   a base layer comprising a grid of spaced apart conductive lines, and diamond in the spaces between adjacent ones of said conductive lines, said conductive lines having a relatively close lattice match to diamond, said base layer having first and second opposing faces;
   a first diamond layer on said first face of said base layer;
   a second diamond layer on said second face of said base layer;
   an emitter contact electrically connected to said first diamond layer;
   a collector contact electrically connected to said second diamond layer; and
   a substrate, between said first diamond layer and said emitter contact, said substrate being selected from the group consisting of crystalline silicon carbide, cubic boron nitride, crystalline copper and crystalline nickel.

* * * * *

UNITED STATES PATENT AND TRADEMARK OFFICE
CERTIFICATE OF CORRECTION

PATENT NO. : 5,371,378
DATED : December 6, 1994
INVENTOR(S) : Das

It is certified that error appears in the above-identified patent and that said Letters Patent is hereby corrected as shown below:

```
    Column 2, line 1, "84-186" should be --184-186--.
    Column 8, line 13, "800Å-2500521" should be --800Å-
2500Å--.
    Column 8, line 34, before "14" insert --12, --.
    Column 8, line 61, "said first face" should be
--said second face--.
```

Signed and Sealed this

Tenth Day of September, 1996

Attest:

BRUCE LEHMAN

Attesting Officer     Commissioner of Patents and Trademarks